(12) United States Patent
Aoki et al.

(10) Patent No.: US 12,224,236 B2
(45) Date of Patent: Feb. 11, 2025

(54) SEMICONDUCTOR DEVICE AND SUBSTRATE

(71) Applicant: Kioxia Corporation, Tokyo (JP)

(72) Inventors: Hideo Aoki, Yokohama (JP); Hideko Mukaida, Taito (JP); Satoshi Tsukiyama, Yokohama (JP)

(73) Assignee: Kioxia Corporation, Tokyo (JP)

( * ) Notice: Subject to any disclaimer, the term of this patent is extended or adjusted under 35 U.S.C. 154(b) by 624 days.

(21) Appl. No.: 17/460,468

(22) Filed: Aug. 30, 2021

(65) Prior Publication Data
US 2022/0246516 A1    Aug. 4, 2022

(30) Foreign Application Priority Data

Feb. 2, 2021 (JP) ................................ 2021-015245

(51) Int. Cl.
*H01L 23/498* (2006.01)
*H01L 25/18* (2023.01)

(52) U.S. Cl.
CPC .. *H01L 23/49894* (2013.01); *H01L 23/49816* (2013.01); *H01L 23/49822* (2013.01); *H01L 25/18* (2013.01)

(58) Field of Classification Search
CPC ......... H01L 23/49894; H01L 23/49816; H01L 23/49822; H01L 25/18
See application file for complete search history.

(56) References Cited

U.S. PATENT DOCUMENTS

| | | | |
|---|---|---|---|
| 5,781,264 A * | 7/1998 | Noda | G02F 1/13452 |
| | | | 349/150 |
| 6,136,733 A | 10/2000 | Blumberg et al. | |
| 8,394,731 B2 | 3/2013 | Sato et al. | |
| 10,616,998 B2 * | 4/2020 | Yang | H01L 23/49838 |
| 10,714,415 B2 * | 7/2020 | Hayashi | H01L 21/6835 |
| 2011/0248394 A1 * | 10/2011 | Chen | H01L 24/49 |
| | | | 257/676 |
| 2011/0316148 A1 | 12/2011 | Kondo et al. | |
| 2013/0200528 A1 * | 8/2013 | Lin | H01L 24/97 |
| | | | 257/774 |
| 2013/0242520 A1 | 9/2013 | Onozuka | |

(Continued)

FOREIGN PATENT DOCUMENTS

| | | | |
|---|---|---|---|
| JP | 10-245743 | * | 9/1998 |
| JP | 3138215 B2 | | 2/2001 |

(Continued)

*Primary Examiner* — Benjamin Tzu-Hung Liu
(74) *Attorney, Agent, or Firm* — Oblon, McClelland, Maier & Neustadt, L.L.P.

(57) ABSTRACT

A semiconductor device according to an embodiment includes a substrate and a semiconductor chip. The semiconductor chip is provided over the substrate. The substrate includes a wire layer and an insulating layer. The wire layer includes a wire electrically connected to the semiconductor chip. The insulating layer is provided in contact with the wire layer and includes a glass woven fabric containing a resin. The glass woven fabric includes a plurality of glass fibers that are provided along two or more directions parallel with the glass woven fabric and are woven. The glass fibers differ in at least one of the material, number, and thickness depending on the directions parallel with the glass woven fabric.

12 Claims, 16 Drawing Sheets

(56) References Cited

U.S. PATENT DOCUMENTS

| | | | |
|---|---|---|---|
| 2014/0020941 A1* | 1/2014 | Ueda | H05K 1/0306 |
| | | | 174/258 |
| 2016/0165714 A1* | 6/2016 | Chen | H05K 3/4602 |
| | | | 174/250 |
| 2016/0307834 A1 | 10/2016 | Suzuki | |
| 2017/0231086 A1* | 8/2017 | Kreutzwiesner | H05K 3/4602 |
| 2018/0114747 A1* | 4/2018 | Delacruz | H01L 21/4857 |
| 2020/0126947 A1* | 4/2020 | Karasawa | H01L 25/162 |

FOREIGN PATENT DOCUMENTS

| | | |
|---|---|---|
| JP | 2002-151617 A | 5/2002 |
| JP | 2007-273632 A | 10/2007 |
| JP | 2014-22622 A | 2/2014 |
| JP | 2014-90027 A | 5/2014 |
| JP | 5552969 B2 | 7/2014 |
| JP | 2019-36710 A | 3/2019 |
| WO | WO 2008/056500 A1 | 5/2008 |
| WO | WO 2008/059741 A1 | 5/2008 |
| WO | WO 2012/067094 A1 | 5/2012 |
| WO | WO 2012/140908 A1 | 10/2012 |
| WO | WO 2013/172008 A1 | 11/2013 |

* cited by examiner

SEMICONDUCTOR DEVICE AND SUBSTRATE

CROSS REFERENCE TO RELATED APPLICATIONS

This application is based upon and claims the benefit of priority from the prior Japanese Patent Application No. 2021-015245, filed on Feb. 2, 2021, the entire contents of which are incorporated herein by reference.

FIELD

The embodiments of the present invention relate to a semiconductor device and a substrate.

BACKGROUND

In a package structure of a semiconductor device, a semiconductor chip, such as a memory chip, is provided over a substrate.

However, with an increase in the capacity and a reduction in the thickness of a package in recent years, there have been cases where a substrate (i.e., the package) warps due to the difference in the coefficient of thermal expansion between silicon (Si) of a memory chip and the substrate.

DETAILED DESCRIPTION

Figure 1:
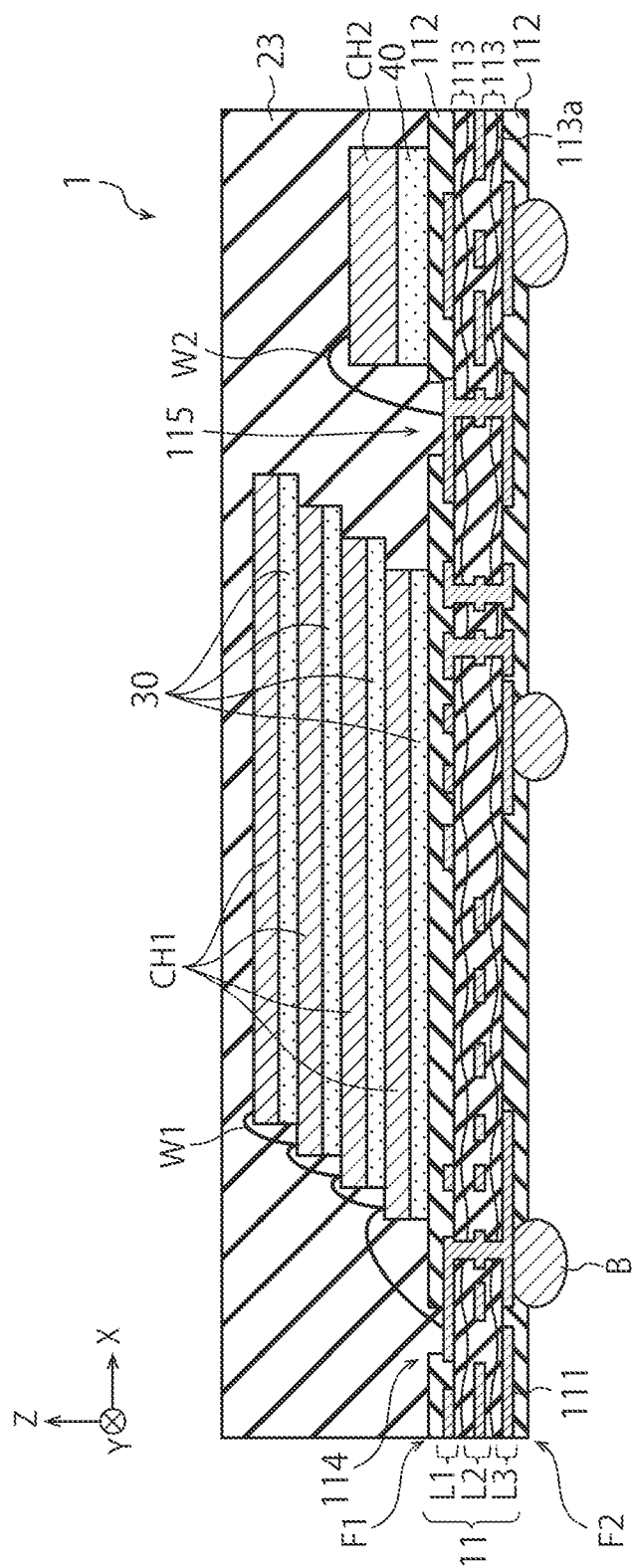
FIG. 1 is a cross-sectional view illustrating an exemplary configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a substrate and a semiconductor chip. The semiconductor chip is provided over the substrate. The substrate includes a wire layer and an insulating layer. The wire layer includes a wire electrically connected to the semiconductor chip. The insulating layer is provided in contact with the wire layer and includes a glass woven fabric containing a resin. The glass woven fabric includes a plurality of glass fibers that are provided along two or more directions parallel with the glass woven fabric and are woven. The glass fibers differ in at least one of the material, number, and thickness depending on the directions parallel with the glass woven fabric.

First Embodiment

FIG. 1 is a cross-sectional view illustrating an exemplary configuration of a semiconductor device 1 according to a first embodiment. The semiconductor device 1 includes a wiring substrate 11, bonding layers 30 and 40, semiconductor chips CH1 and CH2, wires W1 and W2, a resin 23, and metal bumps B.

The wiring substrate 11 is a substrate, such as a printed circuit board, for example. The wiring substrate 11 can be connected to the semiconductor chips CH1 and CH2 via the wires W1 and W2, respectively.

Each of the bonding layers 30 and 40 is a film-form resin (DAF: Die Attach Film), for example. The bonding layers 30 and 40 are provided above the wiring substrate 11.

The semiconductor chips CH1 are memory chips, for example. The semiconductor chips CH1 are NAND chips, for example. Each semiconductor chip CH1 includes semiconductor elements, for example. The semiconductor elements correspond to, for example, a memory cell array or a CMOS (Complementary Metal Oxide Semiconductor) circuit. Each semiconductor chip CH1 is bonded onto the wiring substrate 11 or onto another semiconductor chip CH1 by each bonding layer 30. In the example illustrated in FIG. 1, four semiconductor chips CH1 are stacked in the vertical direction with the bonding layers 30 interposed therebetween. The vertical direction is a direction substantially perpendicular to a substrate upper face F1 of the wiring substrate 11. The plurality of stacked semiconductor chips CH1 are memory chips with an identical configuration, for example. It should be noted that the number of the stacked semiconductor chips CH1 is not limited to four and may be changed as appropriate. The number of the stacked semiconductor chips CH1 is set according to the memory capacity that is necessary. In addition, the semiconductor chips CH1 are stacked by being displaced in a stepwise manner as illustrated in FIG. 1. This can suppress overlap of an upper portion of an electrode pad (not illustrated) of each semiconductor chip CH1 and another semiconductor chip CH1, and thus allows the wire W1 to be connected to the electrode pad of each semiconductor chip CH1.

The semiconductor chip CH2 is a controller chip, for example. The semiconductor chip CH2 includes a CMOS circuit, for example. The semiconductor chip CH2 is electrically connected to the semiconductor chips CH1 and controls the operations of the semiconductor chips CH1. The semiconductor chip CH2 is provided adjacent to the semiconductor chips CH1 and is bonded to the wiring substrate 11 by the bonding layer 40 as illustrated in FIG. 1, for example. Alternatively, the semiconductor chip CH2 may be provided above the semiconductor chips CH1, for example.

The wire W1 electrically connects the wiring substrate 11 and the semiconductor chips CH1. The material of the wire W1 is a conductive metal, such as gold, silver, or copper, for example.

The wire W2 electrically connects the wiring substrate 11 and the semiconductor chip CH2. The material of the wire W2 is a conductive metal, such as gold, silver, or copper, for example.

The resin 23 is an epoxy resin, for example. The resin 23 seals the semiconductor chips CH1 and CH2 and the wires W1 and W2 over the upper face of the wiring substrate 11. This allows the resin 23 to protect the semiconductor chips CH1 and CH2 and the wires W1 and W2 from external shocks and outside air.

The metal bumps B are solder balls, for example. In such a case, the semiconductor device 1 has a BGA (Ball Grid Array) package structure. The metal bumps B electrically connect the semiconductor device 1 to an external substrate for mounting (not illustrated), for example. The material of the metal bumps B is a conductive metal, such as solder. The metal bumps B are provided on the lower face of the wiring substrate 11. That is, the metal bumps B are provided on a face F2 of the wiring substrate 11 on the side opposite to the face F1 over which the semiconductor chips CH1 and CH2 are provided. In the example illustrated in FIG. 1, the metal bumps B are connected to a wire layer L3.

Next, the internal configuration of the wiring substrate 11 will be described. The wiring substrate 11 is a multi-layer substrate, for example. The wiring substrate 11 includes wire layers L1 to L3, resin layers 112, and insulating layers 113.

The wire layers L1 to L3 include wires 111 electrically connected to the semiconductor chips CH1 and CH2. The wires 111 electrically connect electrode pads (i.e., pads 114 and 115) on the upper face of the wiring substrate 11 and the metal bumps B on the lower face of the wiring substrate 11. It should be noted that each of the pads 114 and 115 is a part of the wire layer L1, for example. The material of the wires 111 is a conductive metal, such as copper or tungsten, for example. The wires 111 are included in the plurality of stacked wire layers L1 to L3. The plurality of wire layers L1 to L3 are insulated from each other by the insulating layers 113. In addition, the plurality of wire layers L1 to L3 may be partially electrically connected through via holes, for example.

Each resin layer 112 contains an insulating material, such as solder resist, for example.

Each insulating layer 113 is a prepreg, for example. The insulating layer 113 contains a composite material of a fibrous reinforcing material, such as a glass cloth, and a thermosetting resin, such as epoxy, for example. Each insulating layer 113 has higher strength and rigidity than each resin layer 112.

The insulating layers 113 are provided in contact with the wire layers L1 to L3 in the direction of the normal to the substrate surface of the wiring substrate 11, and each insulating layer 113 includes a glass woven fabric 113a containing a resin. The plurality of insulating layers 113 are provided such that they are alternately stacked with the plurality of wire layers L1 to L3 in the direction of the normal to the substrate surface of the wiring substrate 11, and each insulating layer 113 includes the glass woven fabric 113a containing a resin. In the example illustrated in FIG. 1, two insulating layers 113 are provided, each arranged between an adjacent pair of wire layers among the three wire layers L1 to L3. It should be noted that the number of the stacked insulating layers 113 may be changed according to the number of the stacked wire layers, for example. The number of the stacked insulating layers 113 is not limited to two and may be three or more.

Each insulating layer 113 includes the glass woven fabric 113a. The glass woven fabric 113a is a woven fabric of glass fibers. The glass woven fabric 113a contains a resin. Thus, each insulating layer 113 is formed by impregnating the glass woven fabric 113a with a resin.

Next, the internal configuration of the glass woven fabric 113a will be described.

Figure 2:
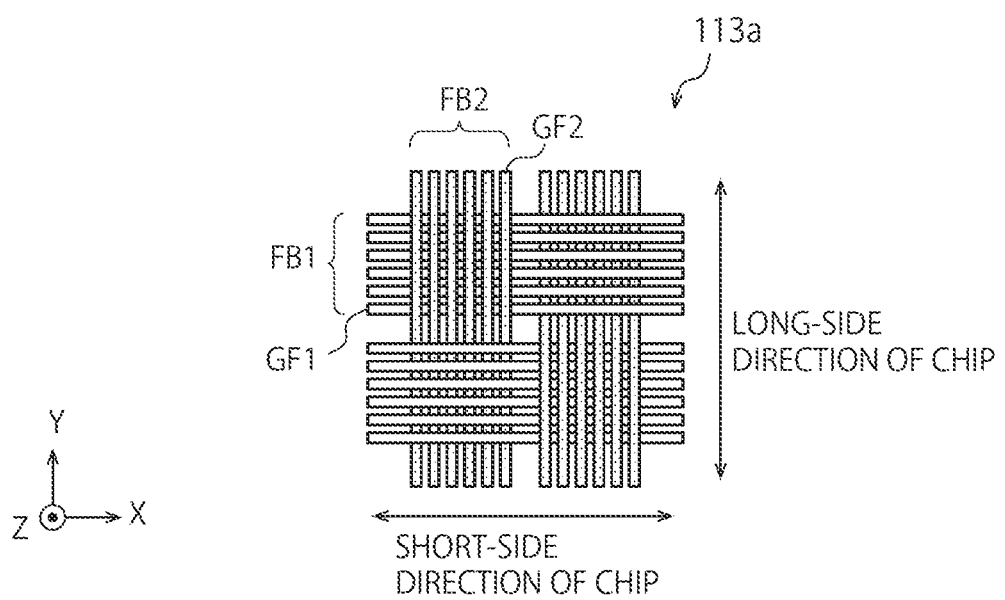
FIG. 2 is a plan view illustrating an exemplary configuration of a glass woven fabric according to the first embodiment.

FIG. 2 is a plan view illustrating an exemplary configuration of the glass woven fabric 113a according to the first embodiment. It should be noted that FIG. 2 is a view in which the glass woven fabric 113a is seen in the direction of the normal to the substrate surface (i.e., the Z-direction).

The glass woven fabric 113a includes fiber bundles FB1 and FB2. The fiber bundles FB1 and FB2 are woven in orthogonal directions, for example. Although the fiber bundles FB1 and FB2 are woven in a plain weave in the example illustrated in FIG. 2, the fiber bundles FB1 and FB2 may have other weave structures. Although the example in FIG. 2 illustrates only two fiber bundles FB1 and two fiber bundles FB2, the glass woven fabric 113a may include more fiber bundles FB1 and FB2 along the XY plane.

The fiber bundles FB1 are provided along the X-direction of FIG. 2, for example. In addition, the plurality of fiber bundles FB1 are arranged side by side in the Y-direction of FIG. 2, for example. Each fiber bundle FB1 includes a plurality of glass fibers GF1. A single fiber bundle FB1 includes several tens of glass fibers GF1, for example.

The fiber bundles FB2 are provided along the Y-direction of FIG. 2, for example. In addition, the plurality of fiber bundles FB2 are arranged side by side in the X-direction of FIG. 2, for example. Each fiber bundle FB2 includes a plurality of glass fibers GF2. A single fiber bundle FB2 includes several tens of glass fibers GF2, for example.

Thus, the glass woven fabric 113a includes the plurality of glass fibers GF1 and GF2 that are provided along two or more directions parallel with the glass woven fabric 113a and are woven in orthogonal directions. More specifically, the glass woven fabric 113 a includes the glass fibers F2 provided along the Y-direction and the glass fibers GF1 provided along the X-direction different from the Y-direction that are woven in orthogonal directions.

The glass fibers GF1 and GF2 differ in at least one of the material, number, and thickness (i.e., fiber diameter) depending on the directions parallel with the glass woven fabric 113a (i.e., the substrate surface). More specifically, the glass fibers GF1 and GF2 have different coefficients of thermal expansion depending on the directions parallel with the glass woven fabric 113a. In the example illustrated in FIG. 2, the directions parallel with the glass woven fabric 113a correspond to the XY plane.

The glass fibers GF1 are E-glass, for example. The coefficient of thermal expansion of E-glass is about 4.4 ppm/° C., for example. The glass fibers GF2 are S-glass, for example. The coefficient of thermal expansion of S-glass is about 2.9 ppm/° C., for example.

Figure 3:
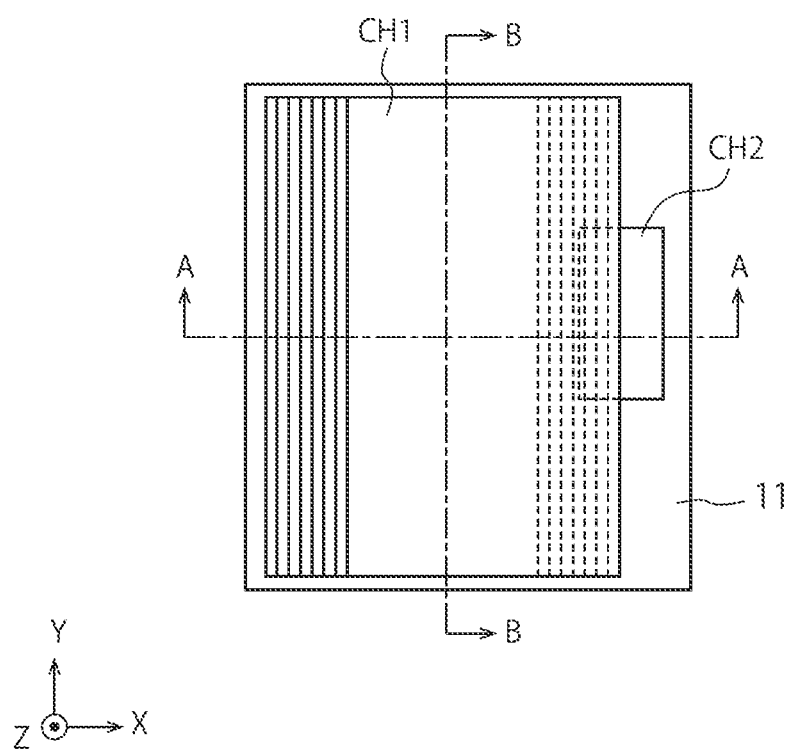
FIG. 3 is a plan view in which semiconductor chips according to the first embodiment are seen in the direction of the normal to a substrate surface.

FIG. 3 is a plan view in which the semiconductor chips CH1 and CH2 according to the first embodiment are seen in the direction of the normal to the substrate surface. Line A-A in FIG. 3 indicates a cross-section corresponding to FIG. 1 that is the cross-sectional view.

The shape of the outer edge of each semiconductor chip CH1 as seen in the direction of the normal to the substrate surface of the wiring substrate 11 is substantially rectangular. In the example illustrated in FIGS. 2 and 3, the long-side direction of each semiconductor chip CH1 corresponds to the Y-direction. The short-side direction of each semiconductor chip CH1 corresponds to the X-direction.

As illustrated in FIG. 2, the glass fibers GF2 that are parallel with the long sides of each semiconductor chip CH1 have a lower coefficient of thermal expansion than the glass fibers GF1 that are parallel with the short sides of each semiconductor chip CH1. That is, the glass fibers GF2 provided along the Y-direction have a lower coefficient of thermal expansion than the glass fibers GF1 provided along the X-direction. The Y-direction is a direction along the long sides of each semiconductor chip CH1. The X-direction is a direction along the short sides of each semiconductor chip CH1. Accordingly, a warp of the resulting package can be suppressed more appropriately according to the size of the warp of the package that depends on the direction.

Next, a warp of the package will be described.

Figure 4A:
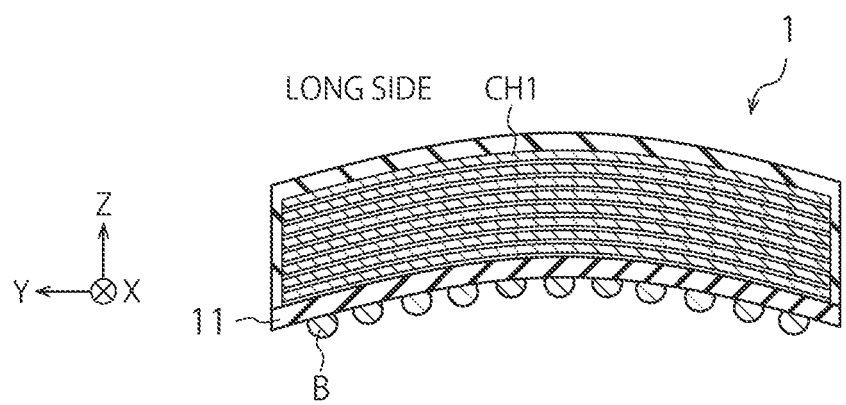
FIG. 4A is a schematic cross-sectional view illustrating an example of a warp of a package due to temperature.
Figure 4B:
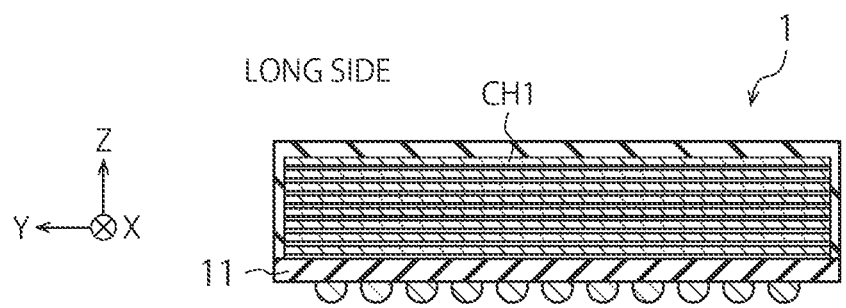
FIG. 4B is a schematic cross-sectional view illustrating an example of a warp of the package due to temperature.
Figure 4C:
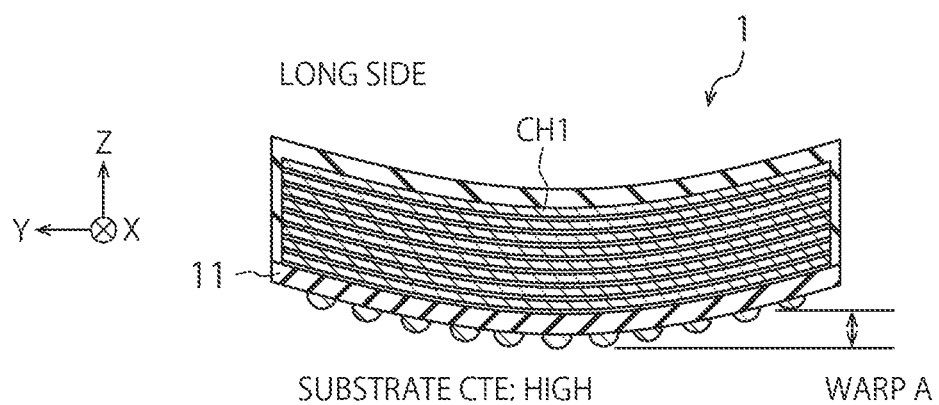
FIG. 4C is a schematic cross-sectional view illustrating an example of a warp of the package due to temperature.

FIGS. 4A to 4C are schematic cross-sectional views each illustrating an example of a warp of the package due to temperature. FIGS. 4A to 4C each illustrate a warp of the package in a cross-section along the long sides of each semiconductor chip CH1. That is, FIGS. 4A to 4C are cross-sectional views along line B-B of FIG. 3. FIG. 4 each illustrate a case where E-glass is used for the glass fibers GF1 and GF2 as a comparative example.

The semiconductor chip CH2 typically has a smaller number of stacked layers than each semiconductor chip CH1 in many cases. In addition, the area of the semiconductor chip CH2 as seen in the direction of the normal to the substrate surface is smaller than the area of each semiconductor chip CH1 in many cases. Thus, the semiconductor chips CH1 influence a warp of the package more strongly than does the semiconductor chip CH2.

FIGS. 4A to 4C illustrate warps of the package due to temperature in ascending order of temperature. FIG. 4A illustrates a warp of the package at about 25° C. that is the room temperature. FIG. 4B illustrates a warp of the package at about 170 to about 180° C. that are the temperatures for curing the resin 23 (i.e., a molding resin). FIG. 4C illustrates a warp of the package at about 250 to about 260° C. that are the reflow temperatures.

A warp of the package occurs due to the difference in the coefficient of thermal expansion (CTE) between the semiconductor chips CH1 and the wiring substrate 11. The coefficient of thermal expansion of silicon (Si), which accounts for a large part of each semiconductor chip CH1, is about 2.5 to about 3.0 ppm/° C., for example. Meanwhile, the coefficient of thermal expansion of the wiring substrate 11 is about 10 to about 15 ppm/° C., for example.

When the temperature drops in a state in which the package is almost flat as in FIG. 4B, the wiring substrate 11 is likely to shrink more than the semiconductor chips CH1. Consequently, as illustrated in FIG. 4A, the package warps in an upwardly projecting manner. Meanwhile, when the temperature increases in a state in which the package is almost flat as in FIG. 4B, the wiring substrate 11 is likely to expand more than the semiconductor chips CH1. Consequently, as illustrated in FIG. 4C, the package warps in a downwardly projecting manner. The size of the warp is indicated by the distance between a metal bump B at the lowest position and a metal bump B at the highest position, for example. In the example illustrated in FIG. 4C, the size of the warp of the package is indicated by a "warp A."

With an increase in the capacity and a reduction in the thickness of a package in recent years, the resin 23 above the semiconductor chips CH1 has been formed thinner. Accordingly, a warp of the package due to the difference in the coefficient of thermal expansion has become more likely to occur. The curvature of a warp depends on the difference in the coefficient of thermal expansion. A warp of the package leads to a decrease in mounting yield, for example.

Therefore, in the first embodiment, as described with reference to FIG. 2, S-glass, which has a lower coefficient of thermal expansion than E-glass that is typically used for the glass woven fabric 113a, is used for the glass fibers GF2 provided along the Y-direction.

Figure 5:
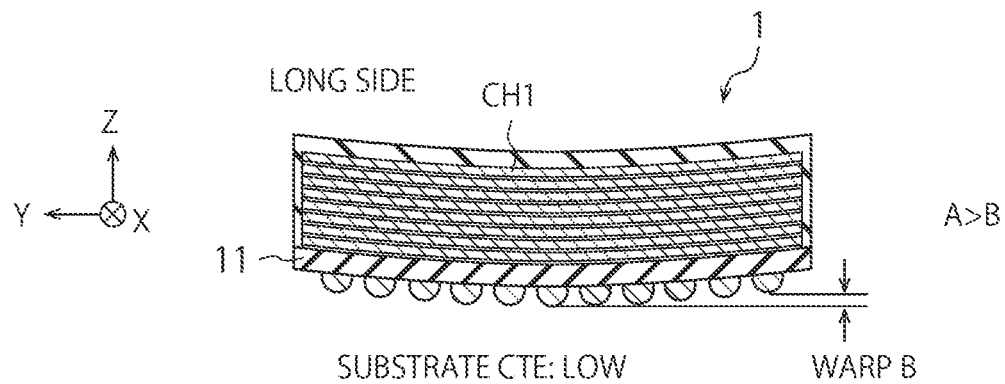
FIG. 5 is a schematic cross-sectional view illustrating an example of a warp of the package in a cross-section along the long sides of each semiconductor chip according to the first embodiment.

FIG. 5 is a schematic cross-sectional view illustrating an example of a warp of the package in a cross-section along the long sides of each semiconductor chip CH1 according to the first embodiment. That is, FIG. 5 is a cross-sectional view along line B-B of FIG. 3. The coefficient of thermal expansion of the wiring substrate 11 in the Y-direction of FIG. 5 is lower than the coefficient of thermal expansion of the wiring substrate 11 in the Y-direction of FIG. 4C. In the Y-direction, the difference in the coefficient of thermal expansion between the wiring substrate 11 and the semiconductor chips CH1 can be made small, and thus, the curvature of a warp can be made small. Consequently, a warp B illustrated in FIG. 5 can be made smaller than the warp A illustrated in FIG. 4C.

As described with reference to FIG. 2, E-glass is used for the glass fibers GF1 provided along the X-direction.

Figure 6:
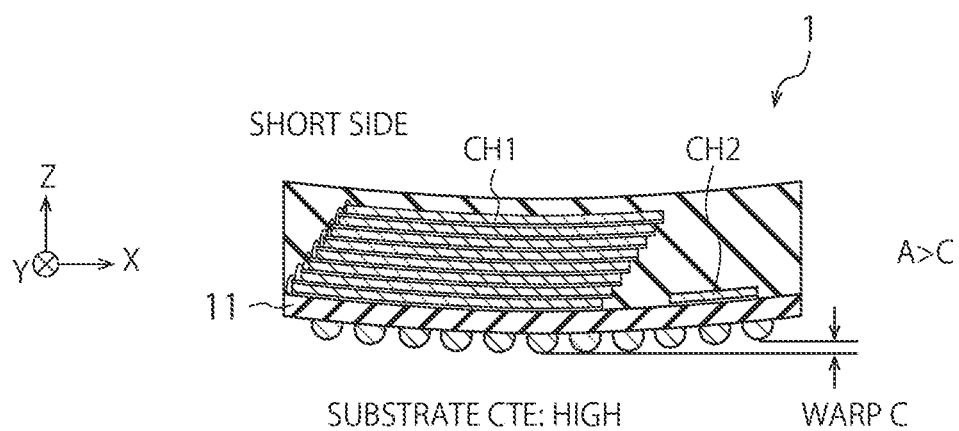
FIG. 6 is a schematic cross-sectional view illustrating an example of a warp of the package in a cross-section along the short sides of each semiconductor chip according to the first embodiment.

FIG. 6 is a schematic cross-sectional view illustrating an example of a warp of the package in a cross-section along the short sides of each semiconductor chip CH1 according to the first embodiment. That is, FIG. 6 is a cross-sectional view along line A-A of FIG. 3. The coefficient of thermal expansion of the wiring substrate 11 in the X-direction of FIG. 6 is substantially the same as the coefficients of thermal expansion of the wiring substrate 11 in the X-direction and the Y-direction of FIG. 4C. A warp C illustrated in FIG. 6 is smaller than the warp A illustrated in FIG. 4C. Typically, the semiconductor chips CH1 are rectangular in shape as seen in a plan view as illustrated in FIG. 3. Among cross-sections of the package, the cross-sectional area of each semiconductor chip CH1 along the short sides thereof is smaller than the cross-sectional area of each semiconductor chip CH1 along the long sides thereof. Accordingly, the size of a warp of the package differs depending on whether the warp occurs in a direction along the long sides or a direction along the short sides of each semiconductor chip CH1.

It should be noted that FIGS. 4C, 5, and 6 illustrate the results of comparison among warps of the package at temperatures higher than the temperature in FIG. 4B. However, a warp of the package at temperatures lower than the temperature in FIG. 4B is also smaller as the coefficient of thermal expansion of the glass fibers is lower and as the warp occurs closer to a direction along the short sides of each semiconductor chip CH1.

As described above, in the first embodiment, the materials of the glass fibers GF1 and GF2 differ depending on the directions parallel with the glass woven fabric 113a. Varying the coefficients of thermal expansion of the glass fibers GF1 and GF2 between the X-direction and the Y-direction can more appropriately suppress a warp of the resulting package along the long sides of each semiconductor chip CH1 where the warp is likely to become large.

In addition, using S-glass not only for the glass fibers GF2 but both for the glass fibers GF1 and GF2 can also suppress a warp of the resulting package. Herein, an upper structure alone is considered that excludes the wiring substrate 11 from the semiconductor device 1. The semiconductor chips CH1 and the resin 23 account for a major part of the upper structure. As illustrated in FIG. 5, when the semiconductor chips CH1 and the resin 23 are compared, the semiconductor chips CH1 account for a larger part of the upper structure in the Y-direction. Meanwhile, as illustrated in FIG. 6, when the semiconductor chips CH1 and the resin 23 are compared, the resin 23 accounts for a larger part of the upper structure in the X-direction than on the long side. The coefficient of linear expansion of the upper structure has a value closer to that of the semiconductor chips CH1 in the Y-direction and has a value closer to that of the resin 23 in the X-direction. That is, the value of the coefficient of linear expansion of the upper structure differs in the X-direction and the Y-direction. The coefficient of thermal expansion of the resin 23 is higher than that of silicon, and is about 8 to 13 ppm/□C, for example. That is, the upper structure has a higher coefficient of linear expansion in the X-direction than in the Y-direction. Therefore, if S-glass is also used for the wiring substrate 11 in the X-direction, the coefficient of linear expansion of the wiring substrate 11 in the X-direction also becomes low, resulting in a large difference in the coefficient of linear expansion between the wiring substrate 11 in the X-direction and the upper structure in the X-direction. This may lead to a bad balance between warps of the resulting package in the X-direction and the Y-direction. The package is mounted on a motherboard, for example. In such a case, stress may be applied to the metal bumps B due to the difference in the coefficient of thermal expansion between the package and the motherboard. If the balance between warps of the package is bad, for example, locally high stress may be applied to the metal bumps B, which can result in lower mounting yields.

In contrast, in the first embodiment, E-glass of the glass fibers GF1 has a higher coefficient of thermal expansion than S-glass of the glass fibers GF2, Accordingly, the balance between warps in the X-direction and the Y-direction can be controlled more appropriately. In addition, stress applied to the metal bumps B when the package is mounted on a motherboard, for example, can be suppressed, and thus, mounting yields can be improved.

First Modified Example of the First Embodiment

Figure 7:
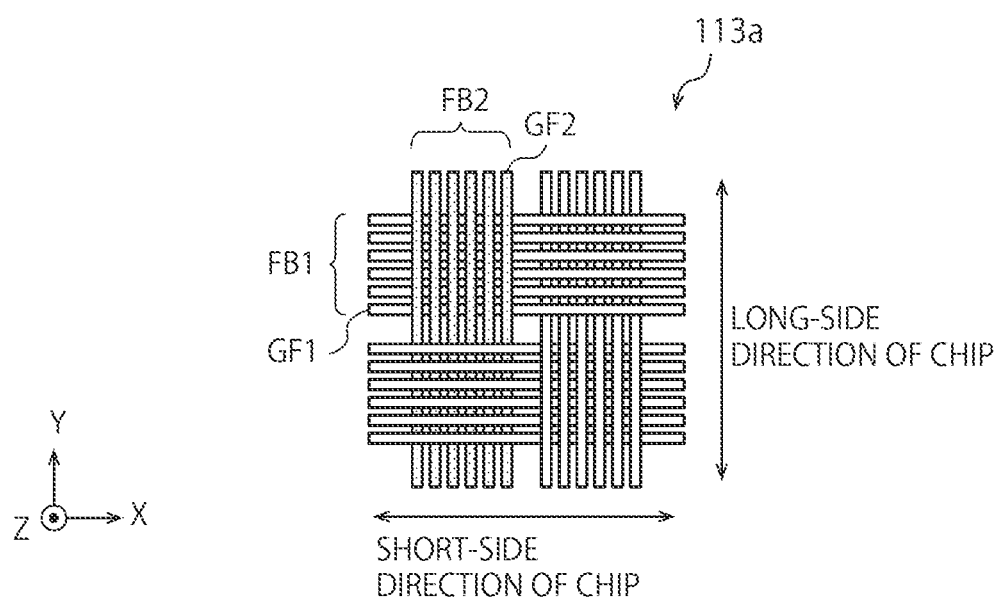
FIG. 7 is a plan view illustrating an exemplary configuration of a glass woven fabric according to a first modified example of the first embodiment.

FIG. 7 is a plan view illustrating an exemplary configuration of the glass woven fabric 113a according to a first modified example of the first embodiment. The first modified example of the first embodiment differs from the first embodiment in that a part of S-glass of the glass fibers GF2 is changed to E-glass.

The proportions of the materials of the glass fibers GF1 and GF2 differ depending on the directions parallel with the glass woven fabric 113a. The materials of the glass fibers GF1 and GF2 are changed in units of the fiber bundles FB1 and FB2, for example.

In the example illustrated in FIG. 7, a half of the plurality of glass fibers GF2 contain S-glass, and the other half contain E-glass. For example, fiber bundles FB2 of S-glass and fiber bundles FB2 of E-glass are alternately arranged. Accordingly, the coefficient of thermal expansion of the glass woven fabric 113a in the Y-direction can be adjusted to a value between when all of the glass fibers GF2 contain E-glass and when all of the glass fibers GF2 contain S-glass, for example. Consequently, a warp of the resulting package can be adjusted depending on the directions.

The same holds true for when the proportions of the materials of the glass fibers GF1 are changed.

The semiconductor device 1 and the wiring substrate 11 according to the first modified example of the first embodiment can obtain advantageous effects similar to those of the first embodiment.

Second Modified Example of the First Embodiment

Figure 8:
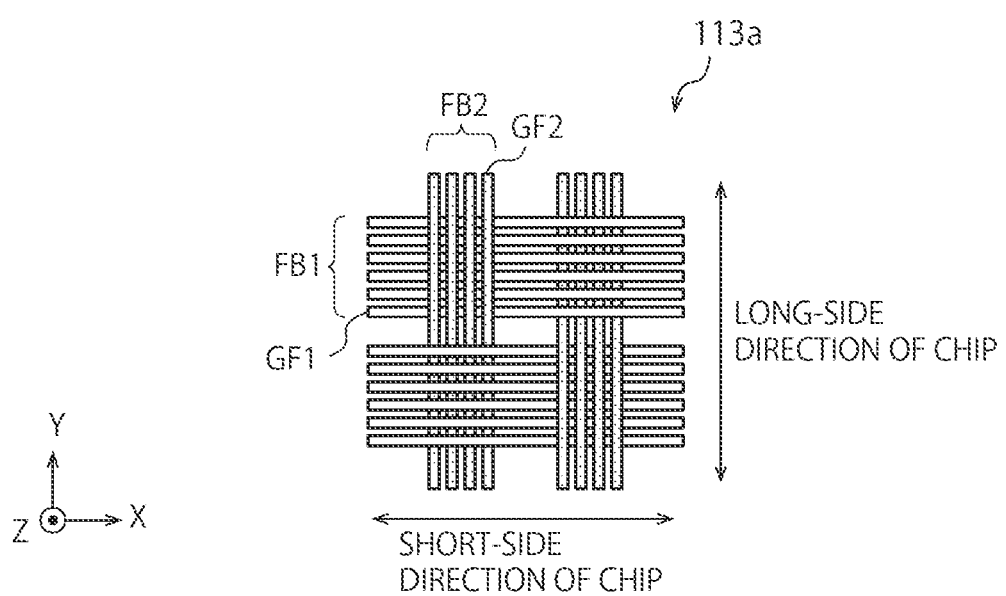
FIG. 8 is a plan view illustrating an exemplary configuration of a glass woven fabric according to a second modified example of the first embodiment.

FIG. 8 is a plan view illustrating an exemplary configuration of the glass woven fabric 113 a according to a second modified example of the first embodiment. The second modified example of the first embodiment example differs from the first embodiment in that the number of the glass fibers GF1 per fiber bundle FB1 and the number of the glass fibers GF2 per fiber bundle FB2 are changed depending on the directions.

The numbers of the glass fibers GF1 and GF2 differ depending on the directions parallel with the glass woven fabric 113a.

In the example illustrated in FIG. 8, the number of the glass fibers GF2 is smaller than the number of the glass fibers GF1. Thus, the rigidity of the glass woven fabric 113a can be changed depending on the directions. Accordingly, a warp of the resulting package can be adjusted depending on the directions.

The same holds true for when the number of the glass fibers GF1 is changed.

It is also possible to change the thickness (i.e., fiber diameter) of the glass fibers GF1 and GF2 instead of changing the numbers of the glass fibers GF1 and GF2.

The semiconductor device 1 and the wiring substrate 11 according to the second modified example of the first embodiment can obtain advantageous effects similar to those of the first embodiment. In addition, the semiconductor device 1 and the wiring substrate 11 according to the second modified example of the first embodiment may be combined with the first modified example of the first embodiment.

Second Embodiment

Figure 9:
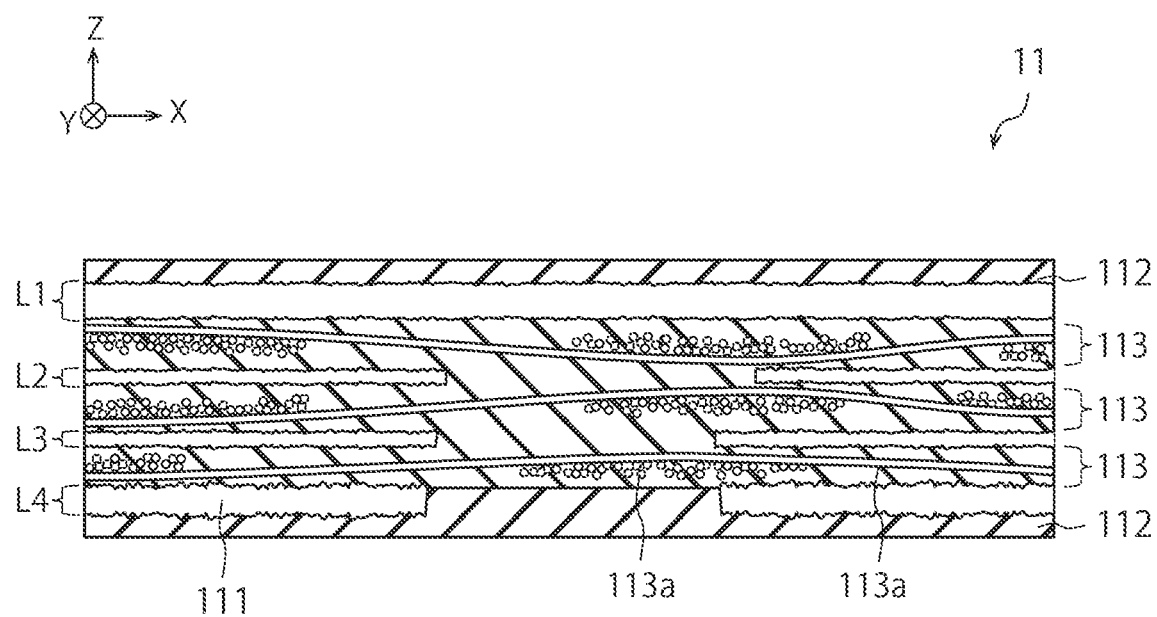
FIG. 9 is a cross-sectional view illustrating an exemplary configuration of a wiring substrate according to a second embodiment.

FIG. 9 is a cross-sectional view illustrating an exemplary configuration of the wiring substrate 11 according to a second embodiment. The second embodiment differs from the first embodiment in that the materials of the glass fibers GF1 and GF2 are changed for each insulating layer 113.

FIG. 9 illustrates a cross-section of three layers of glass woven fabrics 113 a woven in a plain weave. In the example illustrated in FIG. 9, four wire layers L1 to L4 and three insulating layers 113 are provided.

The glass fibers GF1 and GF2 differ in at least one of the material, number, and thickness depending on the insulating layers 113. More specifically, the glass fibers GF1 and GF2 have different coefficients of thermal expansion depending on the insulating layers 113.

Figure 10:
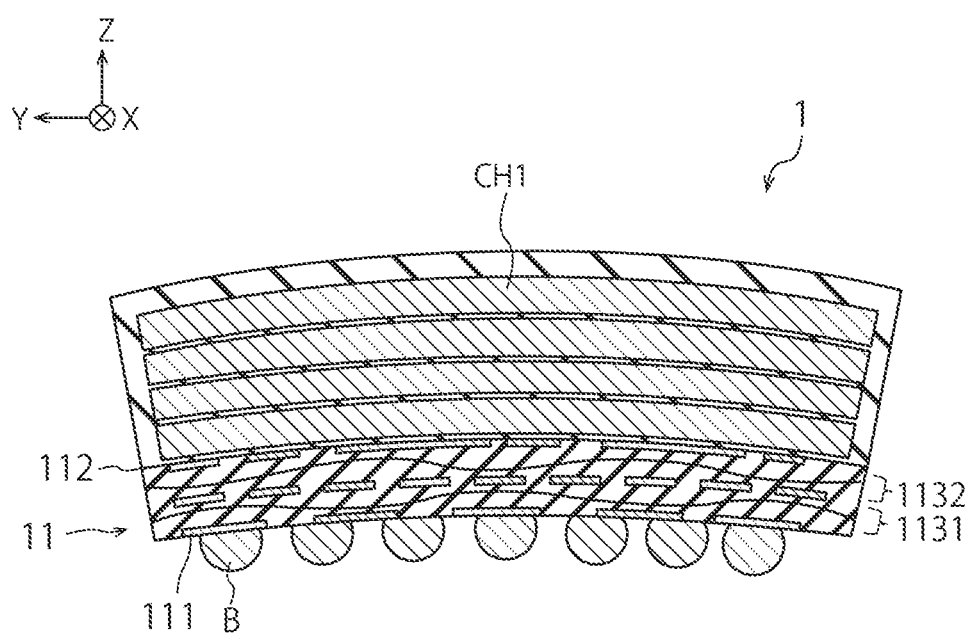
FIG. 10 is a cross-sectional view illustrating an exemplary configuration of a semiconductor device according to the second embodiment.

FIG. 10 is a cross-sectional view illustrating an exemplary configuration of the semiconductor device 1 according to the second embodiment. FIG. 10 illustrates a cross-sectional view of a package in a cross-section along the long sides of each semiconductor chip CH1. In FIG. 10, the bonding layers 30 and the like are omitted.

In the example illustrated in FIG. 10, two insulating layers 113 are provided. As described with reference to FIG. 4A, the entire package warps in an upwardly projecting manner at room temperature.

Glass fibers GF1 and GF2 in an insulating layer 1131 among the plurality of insulating layers 113 have a lower coefficient of thermal expansion than glass fibers GF1 and GF2 in an insulating layer 1132 that is located closer to the semiconductor chips CH1 than is the insulating layer 1131. The glass fibers GF1 and GF2 in the glass woven fabric 113 a of the insulating layer 1131 are S-glass, for example. The glass fibers GF1 and GF2 in the glass woven fabric 113 a of the insulating layer 1132 are E-glass, for example. In such a case, the wiring substrate 11 has a higher coefficient of thermal expansion at positions closer to the semiconductor chips CH1, and has a smaller coefficient of thermal expansion at positions closer to the metal bumps B. When the wiring substrate 11 is produced, the insulating layers 1131 and 1132 are bonded together, and then are heated to the curing temperature of the wiring substrate 11 (for example, one hundred and tens of ° C. to about 200° C.). The wiring substrate 11 is almost flat at the curing temperature. As described above, the insulating layer 1132 on the side of the semiconductor chips CH1 has a higher coefficient of thermal expansion than the insulating layer 1131 on the side of the metal bumps B. Accordingly, when the temperature of the wiring substrate 11 drops to room temperature, the insulating layer 1132 shrinks more than the insulating layer 1131. Thus, stress, which would cause the wiring substrate 11 alone to warp in a downwardly projecting manner, is generated in the wiring substrate 11 at room temperature. Therefore, an upwardly projecting warp of the wiring substrate 11 illustrated in FIG. 10 can be suppressed, and thus, an upwardly projecting warp of the resulting package can be suppressed. Further, cracks can be suppressed. For example, cracks of the resin layer 112 on the side of the semiconductor chips CH1 and cracks of the wires 111 can be suppressed. Further, stress applied to the metal bumps B can be reduced, for example, and thus, cracks of joint portions can be suppressed. Consequently, the life can be prolonged.

It should be noted that the proportions of the materials of the glass fibers GF1 and GF2 may differ depending on the insulating layers 113.

First Modified Example of the Second Embodiment

Figure 11:
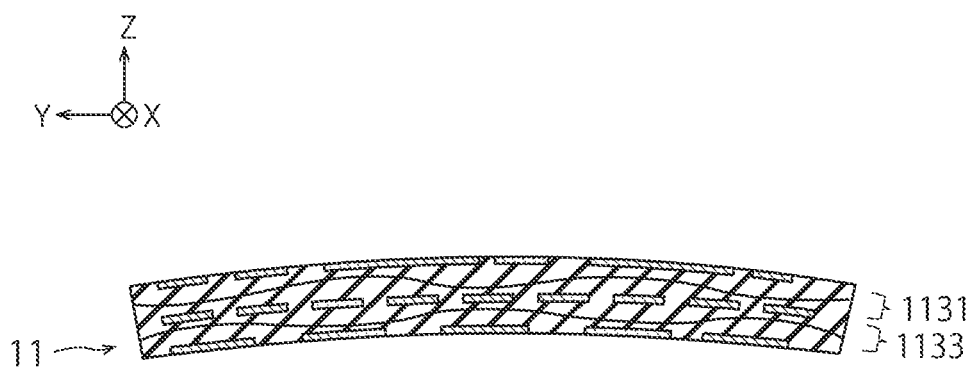
FIG. 11 is cross-sectional view illustrating the configuration of a wiring substrate according to a first modified example of the second embodiment.

FIG. 11 is cross-sectional view illustrating the configuration of the wiring substrate 11 according to a first modified example of the second embodiment. The first modified example of the second embodiment is opposite to the second embodiment in the magnitude relationship between the coefficients of thermal expansion of the two insulating layers 113. FIG. 11 illustrates the wiring substrate 11 before the semiconductor chips CH1 and the like are mounted thereon.

Glass fibers GF1 and GF2 in the insulating layer 1131 among the plurality of insulating layers 113 have a lower coefficient of thermal expansion than glass fibers GF1 and GF2 in an insulating layer 1133 that is located further from the semiconductor chips CH1 than is the insulating layer 1131. The glass fibers GF1 and GF2 in the glass woven fabric 113 a of the insulating layer 1131 are S-glass, for example. The glass fibers GF1 and GF2 in the glass woven fabric 113 a of the insulating layer 1133 are E-glass, for example. In such a case, the wiring substrate 11 has a lower coefficient of thermal expansion at positions closer to the semiconductor chips CH1 and has a higher coefficient of thermal expansion at positions closer to the metal bumps B. When the wiring substrate 11 is produced, the insulating layers 1131 and 1133 are bonded together, and then are heated to the curing temperature of the wiring substrate 11 (for example, one hundred and tens of ° C. to about 200° C.). The wiring substrate 11 is almost flat at the curing temperature. As described above, the insulating layer 1133 on the side of the metal bumps B (i.e., the lower side on the sheet of FIG. 11) has a higher coefficient of thermal expansion than the insulating layer 1131 on the side of the semiconductor chips CH1 (i.e., the upper side on the sheet of FIG. 11). Accordingly, when the temperature of the wiring substrate 11 drops to room temperature, the insulating layer 1133 shrinks more than the insulating layer 1131. Thus, stress, which would cause the wiring substrate 11 alone to warp in an upwardly projecting manner, is generated in the wiring substrate 11 at room temperature.

Figure 12:
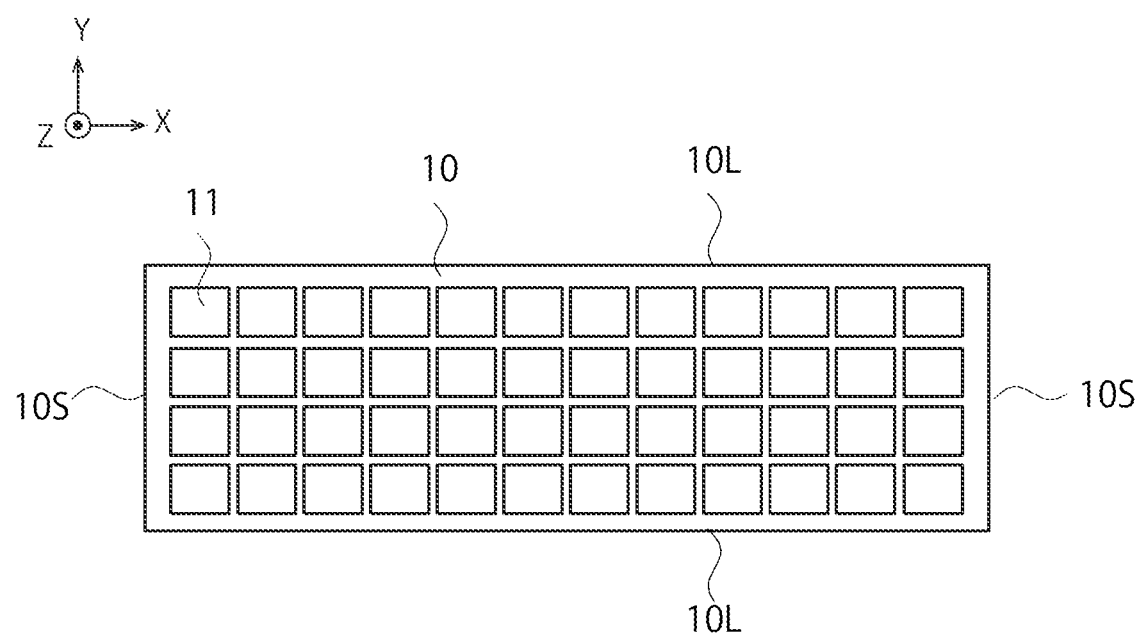
FIG. 12 is a plan view illustrating the configuration of a multi-pattern substrate according to the first modified example of the second embodiment.

FIG. 12 is a plan view illustrating the configuration of a multi-pattern substrate 10 according to the first modified example of the second embodiment.

To efficiently produce packages, for example, there are cases where the semiconductor chips CH1 and CH2 and the like are first mounted on the multi-pattern substrate 10 including a plurality of wiring substrates 11, and then, the multi-pattern substrate 10 is cut into the individual wiring substrates 11 so that a plurality of packages are produced. In the example illustrated in FIG. 12, a single multi-pattern substrate 10 includes 48 (4×12) wiring substrates 11. In an assembly step, the multi-pattern substrates 10 are conveyed one by one. Herein, with a reduction in the thickness of the wiring substrates 11, the rigidity of the wiring substrates 11 has become lower. In such a case, the multi-pattern substrate 10 is likely to warp under its own weight during a conveying step or during storage (i.e., storage into a magazine). Such a warp of the multi-pattern substrate 10 may lead to a trouble while the multi-pattern substrate 10 is conveyed. The multi-pattern substrate 10 is conveyed with its opposite long sides 10L held, for example. When the long sides 10L are held, a cross-section parallel with the short sides 10S of the multi-pattern substrate 10 is likely to warp in a downwardly projecting manner due to the weight of the multi-pattern substrate 10.

In contrast, in the first modified example of the second embodiment, as illustrated in FIG. 11, stress, which would cause the wiring substrates 11 (or the multi-pattern substrate 10) to warp in an upwardly projecting manner, is generated therein at room temperature. This can suppress a downward projecting warp of the multi-pattern substrate 10 under its own weight. For example, cancelling a downward projecting warp of the multi-pattern substrate 10 under its own weight can maintain the multi-pattern substrate 10 flat. Consequently, troubles that would occur while the multi-pattern substrate 10 is conveyed can be suppressed.

It should be noted that the proportions of the materials of the glass fibers GF1 and GF2 may differ depending on the insulating layers 113.

Second Modified Example of the Second Embodiment

Figure 13:
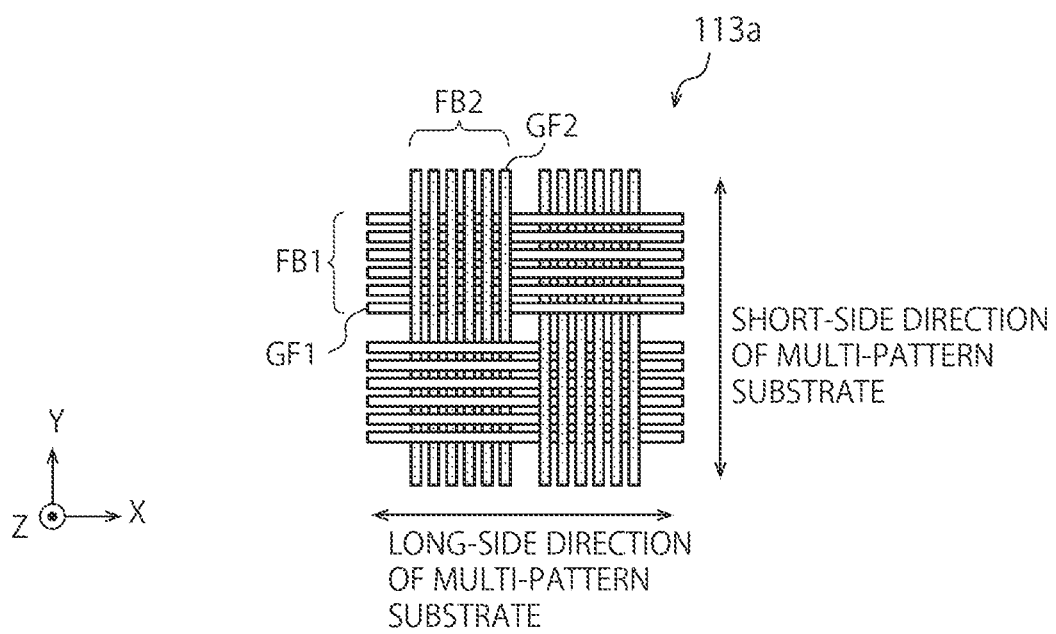
FIG. 13 is a plan view illustrating an exemplary configuration of a glass woven fabric according to a second modified example of the second embodiment.

FIG. 13 is a plan view illustrating an exemplary configuration of the glass woven fabric 113 a according to a second modified example of the second embodiment. The second modified example of the second embodiment differs from the first modified example of the second embodiment in that the materials of the glass fibers GF1 and GF2 are changed depending on the directions parallel with the glass woven fabric 113a.

The glass fibers GF1 and GF2 in at least one of the insulating layer 1131 and the insulating layer 1133 have different coefficients of thermal expansion depending on the directions parallel with the glass woven fabric 113a. More specifically, the glass fibers GF2 along the short sides 10S of the multi-pattern substrate 10 have a lower coefficient of thermal expansion than the glass fibers GF1 along the long sides 10L of the multi-pattern substrate 10. In the example illustrated in FIG. 13, the short sides 10S correspond to the Y-direction, and the long sides 10L correspond to the X-direction. The glass fibers GF2 in the insulating layer 1131 are S-glass, for example. The glass fibers GF1 in the insulating layer 1131 are E-glass, for example. The glass fibers GF1 and GF2 in the insulating layer 1133 are E-glass, for example. As described above, since the multi-pattern substrate 10 hardly warps under its own weight in the direction along the long sides 10L, the material of the glass fibers GF1 lying in the direction along the short sides 10S may be changed.

It should be noted that the proportions of the materials of the glass fibers GF1 and GF2 may differ depending on the directions parallel with the glass woven fabric 113a.

The semiconductor device 1 and the wiring substrate 11 according to the second modified example of the second embodiment can obtain advantageous effects similar to those of the first modified example of the second embodiment.

Third Embodiment

Figure 14:
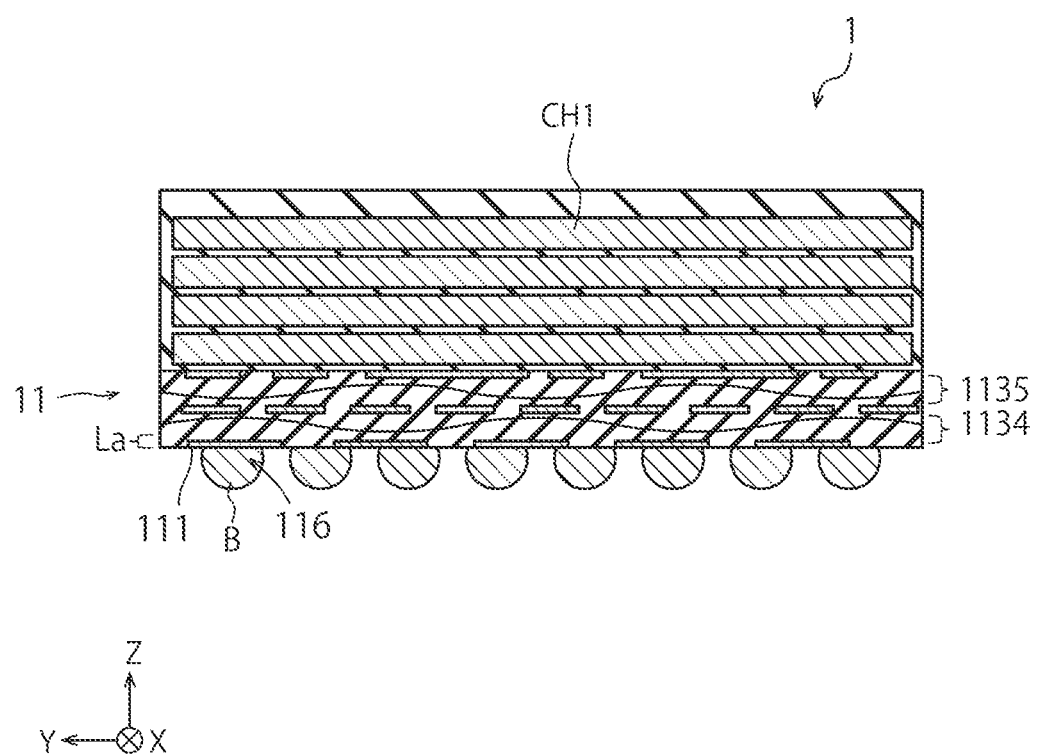
FIG. 14 is a cross-sectional view illustrating an exemplary configuration of a semiconductor device according to a third embodiment.

FIG. 14 is a cross-sectional view illustrating an exemplary configuration of the semiconductor device 1 according to a third embodiment. The third embodiment differs from the second embodiment in that the electrical properties of the glass fibers GF1 and GF2 are changed for each insulating layer 113.

In the example illustrated in FIG. 14, two insulating layers 113 are provided.

The glass fibers GF1 and GF2 have different dielectric constants depending on the insulating layers 113. Glass fibers GF1 and GF2 in an insulating layer 1134 in contact with a wire layer La connected to the metal bumps B have a lower dielectric constant than glass fibers GF1 and GF2 in an insulating layer 1135 that is located further from the wire layer La connected to the metal bumps B than is the insulating layer 1134. The glass fibers GF1 and GF2 in the glass woven fabric 113a of the insulating layer 1134 are NE-glass or D-glass, for example. The glass fibers GF1 and GF2 in the glass woven fabric 113a of the insulating layer 1135 are E-glass, for example. Accordingly, capacitance between the wire layer La connected to the metal bumps B and a wire layer adjacent to the wire layer La can be suppressed. This can suppress an impedance mismatch in ball pads 116 of the wire layer La connected to the metal bumps B.

Typically, the wires 111 connected to the metal bumps B have the ball pads 116 for connection to the metal bumps B. The ball pads 116 have larger areas than other wire paths in the wire layer La. In such a case, capacitance between wires in the ball pads 116 becomes high. The capacitance C is represented by Equation 1 using the dielectric constant E, the area S, and the gap d.

[Expression 1]

$$C = \frac{\varepsilon S}{d} \quad \text{(Equation 1)}$$

An increase in the capacitance C leads to a decrease in the characteristic impedance $Z_0$ of the wires. The characteristic impedance $Z_0$ is represented by Equation 2 using the inductance L and the capacitance C.

[Expression 2]

$$Z_0 = \sqrt{\frac{L}{C}} \quad \text{(Equation 2)}$$

Thus, the characteristic impedance $Z_0$ of each ball pad 116 is lower than the characteristic impedance $Z_0$ of other wires in the wire layer La. Consequently, a signal is reflected, for example, due to the impedance mismatch, resulting in large signal energy loss.

In contrast, in the third embodiment, the dielectric constant ε of the insulating layer 1134 in contact with the ball pads 116 is lowered. Lowering the dielectric constant ε can suppress an increase in the capacitance C of each ball pad 116 with a large area S as indicated by Equation 1. Accordingly, a decrease in the characteristic impedance $Z_0$ of each ball pad 116 can be suppressed, and an impedance mismatch can thus be suppressed. Consequently, signal energy loss can be suppressed, and signal transmission failures can thus be suppressed.

It should be noted that the proportions of the materials of the glass fibers GF1 and GF2 may differ depending on the insulating layers 113.

The third embodiment may be combined with the second embodiment. That is, the glass fibers GF1 and GF2 may differ in at least one of the coefficient of thermal expansion and the dielectric constant depending on the insulating layers 113.

First Modified Example of the Third Embodiment

Figure 15:
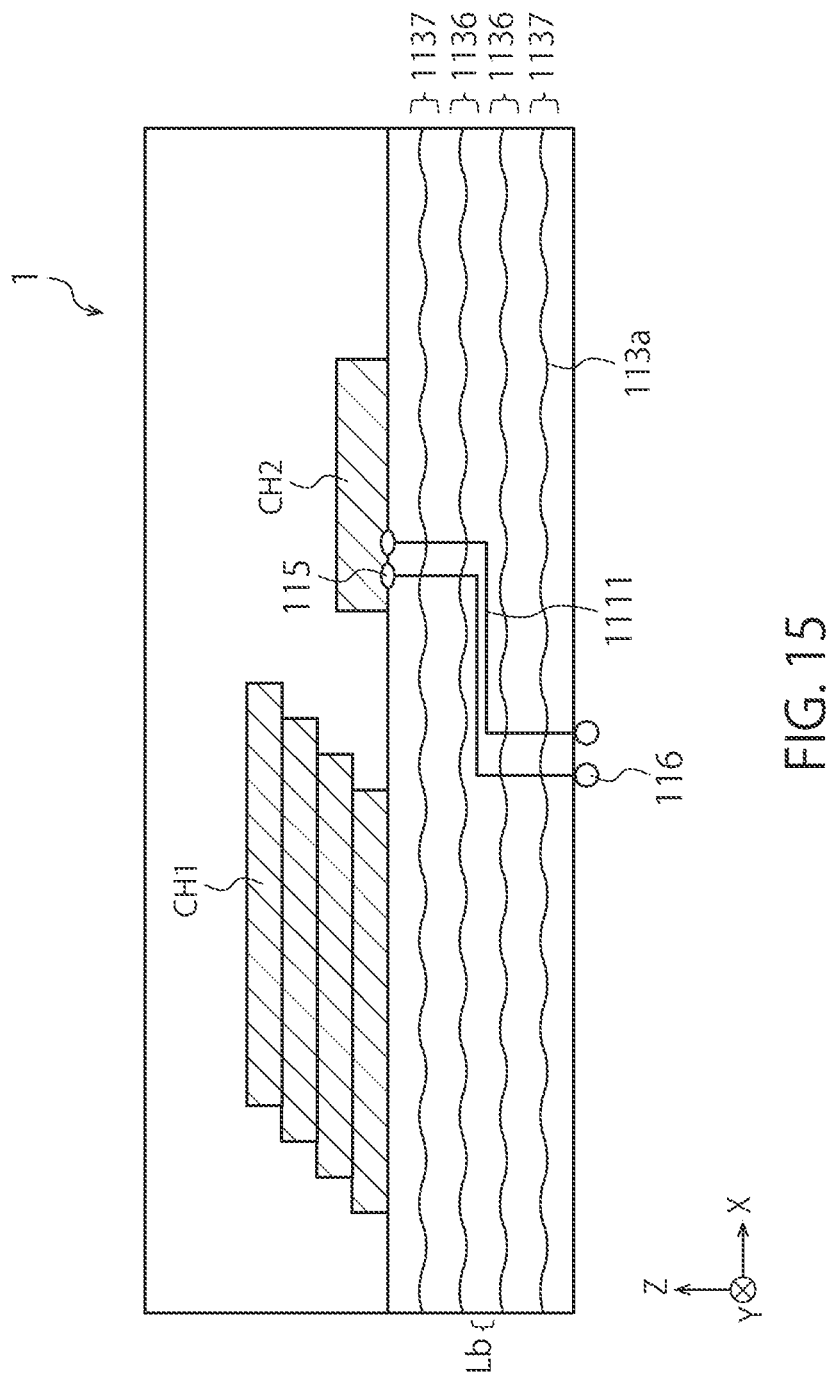
FIG. 15 is a cross-sectional view illustrating an exemplary configuration of a semiconductor device according to a first modified example of the third embodiment.

FIG. 15 is a cross-sectional view illustrating an exemplary configuration of the semiconductor device 1 according to a first modified example of the third embodiment. FIG. 15 illustrates a cross-sectional view of a package in a cross-section along the short sides of each semiconductor chip CH1. The first modified example of the third embodiment differs from the third embodiment in that glass fibers GF1 and GF2 with low dielectric constants are used for insulating layers 113 above and below a wire layer Lb in which a high-speed signal wire 1111 is provided. In FIG. 15, the bonding layers 30 and 40, the wires W1 and W2, and the like are omitted.

The high-speed signal wire 1111 is a wire that transmits a signal with a faster speed than other wires 111. The high-speed signal wire 1111 is a differential wire, for example. The high-speed signal wire 1111 is connected between the semiconductor chip CH2 and the metal bump B. The wire layer Lb in which the high-speed signal wire 1111 is provided and the pad 115, and the wire layer Lb and the ball pad 116 are electrically connected through via holes, for example.

Glass fibers GF1 and GF2 in an insulating layer 1136 in contact with the wire layer Lb including the high-speed signal wire 1111 have lower dielectric constants than glass fibers GF1 and GF2 in an insulating layer 1137 that is located further from the wire layer Lb including the high-speed signal wire than is the insulating layer 1136. In the example illustrated in FIG. 15, the insulating layer 1136 includes two insulating layers 113 sandwiching the wire layer Lb therebetween, for example. The insulating layer 1137 includes insulating layers 113 other than the insulating layer 1136, for example. The glass fibers GF1 and GF2 in the glass woven fabric 113a of the insulating layer 1136 are NE-glass or D-glass, for example. In addition, the glass fibers GF1 and GF2 in the glass woven fabric 113a of the insulating layer 1137 are E-glass, for example. Accordingly, the dielectric constants of the insulating layers 113 around the high-speed signal wire 1111 can be suppressed, and high frequency characteristics can thus be improved. Consequently, dielectric loss can be suppressed, and signal transmission failures due to dielectric loss can thus be suppressed.

It should be noted that the proportions of the materials of the glass fibers GF1 and GF2 may differ depending on the insulating layers 113.

Second Modified Example of the Third Embodiment

Figure 16:
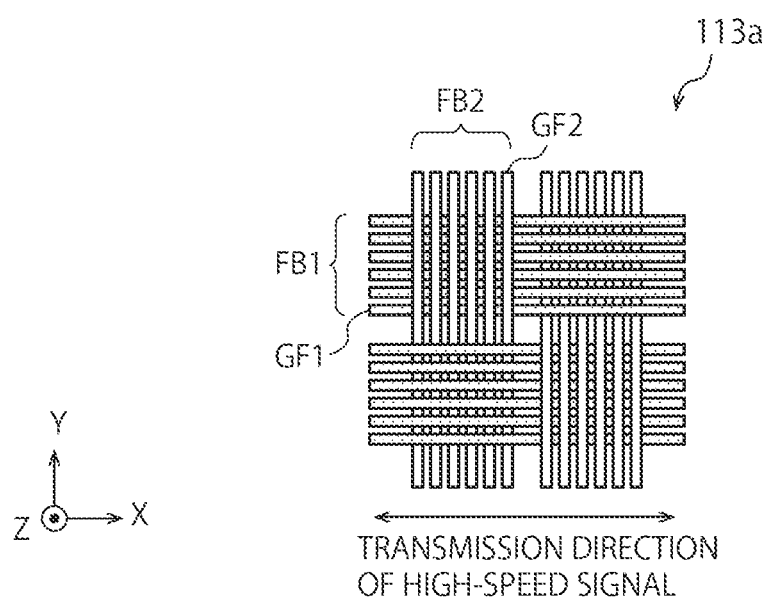
FIG. 16 is a plan view illustrating an exemplary configuration of a glass woven fabric according to a second modified example of the third embodiment.

FIG. 16 is a plan view illustrating an exemplary configuration of the glass woven fabric 113 a according to a second modified example of the third embodiment.

Among the glass fibers in the insulating layer 1136, the glass fibers GF1 provided along the signal transmission direction D of the high-speed signal wire 1111 have a lower dielectric constant than the glass fibers GF2 provided along a direction different from the signal transmission direction D. The glass fibers GF1 in the glass woven fabric 113a of the insulating layer 1136 are NE-glass or D-glass, for example. The glass fibers GF2 in the glass woven fabric 113a of the insulating layer 1136 are E-glass, for example. In the example illustrated in FIG. 16, the signal transmission direction is the X-direction.

Figure 17:
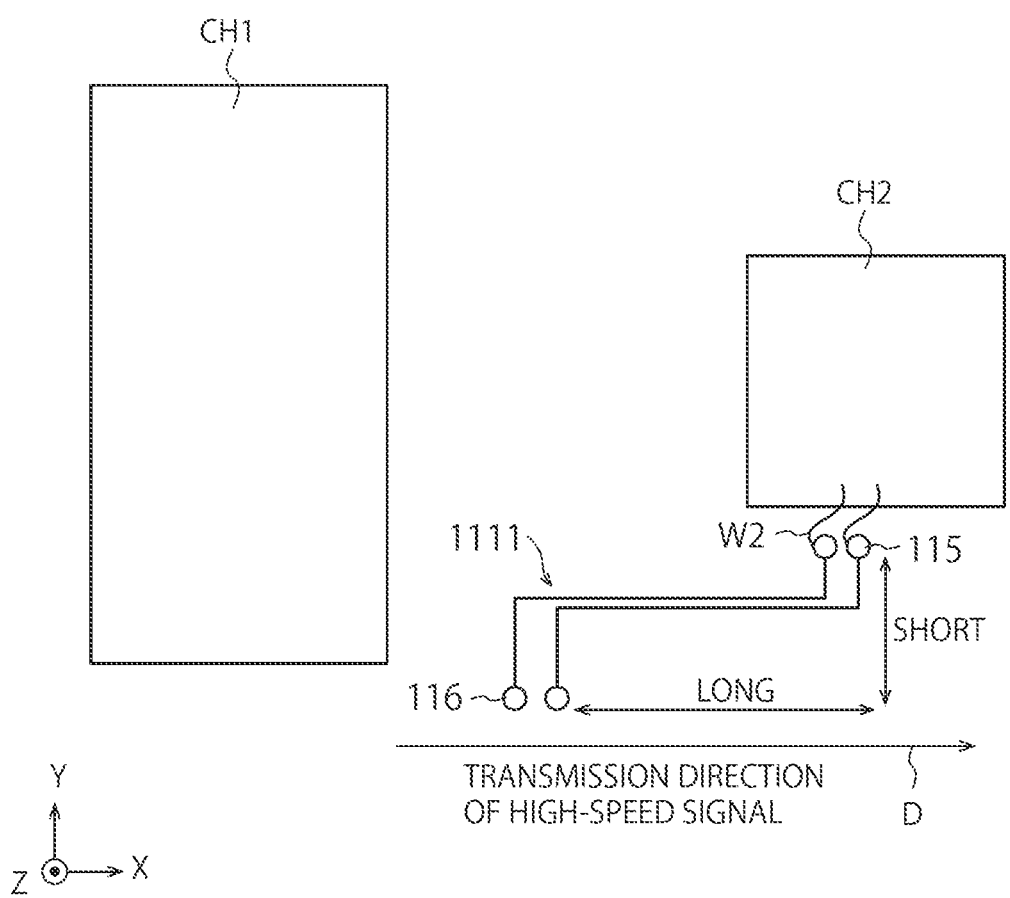
FIG. 17 is a plan view illustrating an example of a high-speed transmission direction according to the second modified example of the third embodiment.

FIG. 17 is a plan view illustrating an example of the signal transmission direction D according to the second modified example of the third embodiment. FIG. 17 schematically illustrates the first-stage semiconductor chip CH1 as seen in the Z-direction, the semiconductor chip CH2, and the high-speed signal wire 1111. The actual arrangement of the semiconductor chips CH1 and CH2 and the high-speed signal wire 1111 is not limited to that in FIG. 17.

The signal transmission direction D is a direction in which the high-speed signal wire 1111 is arranged the longest as seen in the direction of the normal to the substrate surface of the wiring substrate 11. FIG. 17 illustrates the high-speed signal wire 1111 between the pad 115 connected to the semiconductor chip CH2 and the ball pad 116 connected to the metal bump B as seen in the direction of the normal to the substrate surface. In the example illustrated in FIG. 17, the distance of the high-speed signal wire 1111 along the X-direction is longer than the distance of the high-speed signal wire 1111 along the Y-direction. Thus, the signal transmission direction D is the X-direction.

In addition, when NE-glass or D-glass is used not only for the glass fibers GF1 but both for the glass fibers GF1 and GF2, generation of signal transmission failures can also be suppressed. However, when NE-glass or D-glass is also used for the glass fibers GF2, the coefficient of thermal expansion becomes too low, which may result in a bad balance between warps of the resulting package in the X-direction and the Y-direction.

In contrast, according to the second modified example of the third embodiment, the glass fibers GF2 are E-glass. Accordingly, the balance between warps of the resulting package in the X-direction and the Y-direction can be controlled more appropriately. That is, signal transmission failures can be suppressed, and warps of the package can be taken into consideration.

In the examples illustrated in FIGS. 16 and 17, the signal transmission direction D is a direction along the short sides of the semiconductor chip CH1, but may also be a direction along the long sides.

It should be noted that the proportions of the materials of the glass fibers GF1 and GF2 may differ depending on the directions parallel with the glass woven fabric 113a.

The semiconductor device 1 and the wiring substrate 11 according to the second modified example of the third embodiment can obtain advantageous effects similar to those of the first modified example of the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor device comprising:
 a substrate;
 a semiconductor chip provided over the substrate; and
 a sealing resin which is provided over the substrate and seals the semiconductor chip,
 wherein:
 the substrate includes
  a wire layer including a wire electrically connected to the semiconductor chip, and an insulating layer provided in contact with the wire layer and including a glass woven fabric containing a resin, the glass woven fabric includes a plurality of glass fibers that are provided along two or more directions parallel with the glass woven fabric and are woven, the glass fibers differ in at least one of a material, a number, and a thickness depending on the directions parallel with the glass woven fabric, the glass woven fabric includes the glass fibers provided along a first direction and the glass fibers provided along a second direction different from the first direction, the glass fibers provided along the first direction have a lower coefficient of thermal expansion than the glass fibers provided along the second direction, a shape of an outer edge of the semiconductor chip as seen in a direction of a normal to a substrate surface of the substrate is substantially rectangular, the first direction is a direction along long sides of the semiconductor chip, the second direction is a direction along short sides of the semiconductor chip, and the resin accounts for a larger part of a cross-sectional area along the short sides than a cross-sectional area along the long sides.

2. The semiconductor device according to claim 1, wherein the glass fibers have different coefficients of thermal expansion depending on the directions parallel with the glass woven fabric.

3. The semiconductor device according to claim 1, wherein proportions of materials of the glass fibers differ depending on the directions parallel with the glass woven fabric.

4. A semiconductor device comprising:
a substrate; and
a semiconductor chip provided over the substrate, wherein:
the substrate includes
a plurality of wire layers each including a wire electrically connected to the semiconductor chip, and
a plurality of insulating layers provided to be alternately stacked with the plurality of wire layers, each of the insulating layers including a glass woven fabric containing a resin,
the glass woven fabric includes a plurality of glass fibers that are woven,
the glass fibers differ in at least one of a material, a number, and a thickness depending on the insulating layers,
glass fibers in a sixth insulating layer in contact with one of the wire layers including a high-speed signal wire that is configured to transmit a signal with a faster speed than other wires have a lower dielectric constant than glass fibers in a seventh insulating layer, the seventh insulating layer being located further from the one of the wire layers including the high-speed signal wire than is the sixth insulating layer,
the glass woven fabric includes the plurality of glass fibers that are provided along two or more directions parallel with the glass woven fabric and are woven, and
among the glass fibers in the sixth insulating layer, glass fibers provided along a signal transmission direction of the high-speed signal wire have a lower dielectric constant than glass fibers provided along a direction different from the signal transmission direction.

5. The semiconductor device according to claim 4, wherein the glass fibers differ in at least one of a coefficient of thermal expansion and a dielectric constant depending on the insulating layers.

6. The semiconductor device according to claim 5, wherein:
among the glass fibers in the plurality of insulating layers, glass fibers in a first insulating layer have a lower coefficient of thermal expansion than glass fibers in a second insulating layer, the second insulating layer being located closer to the semiconductor chip than is the first insulating layer.

7. The semiconductor device according to claim 5, wherein among the glass fibers in the plurality of insulating layers, glass fibers in a first insulating layer have a lower coefficient of thermal expansion than glass fibers in a third insulating layer, the third insulating layer being located further from the semiconductor chip than is the first insulating layer.

8. The semiconductor device according to claim 7, wherein:
the glass woven fabric includes the plurality of glass fibers that are provided along two or more directions parallel with the glass woven fabric and are woven, and
the glass fibers in at least one of the first insulating layer and the third insulating layer have different coefficients of thermal expansion depending on the directions parallel with the glass woven fabric.

9. The semiconductor device according to claim 5, further comprising a metal bump on a second face of the substrate on a side opposite to a first face over which the semiconductor chip is provided,
wherein:
glass fibers in a fourth insulating layer in contact with one of the wire layers connected to the metal bump have a lower dielectric constant than glass fibers in a fifth insulating layer, the fifth insulating layer being located further from the one of the wire layers connected to the metal bump than is the fourth insulating layer.

10. The semiconductor device according to claim 4, wherein:
the semiconductor chip includes
a memory chip, and
a controller chip configured to control the memory chip, and
the high-speed signal wire is electrically connected to the controller chip.

11. The semiconductor device according to claim 4, wherein the signal transmission direction is a direction in which the high-speed signal wire is arranged longest as seen in a direction of a normal to a substrate surface of the substrate.

12. The semiconductor device according to claim 4, wherein proportions of materials of the glass fibers differ depending on the insulating layers.

* * * * *